United States Patent
Hsieh et al.

(10) Patent No.: US 10,277,209 B2
(45) Date of Patent: Apr. 30, 2019

(54) SWITCHED-CAPACITOR DC-DC CONVERTOR AND CONTROL METHOD THEREOF

(71) Applicant: NUVOTON TECHNOLOGY CORPORATION, Hsinchu (TW)

(72) Inventors: Chung-Ming Hsieh, Hsinchu Science Park (TW); Wei-Chan Hsu, Cupertino, CA (US)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 15/422,155

(22) Filed: Feb. 1, 2017

(65) Prior Publication Data

US 2018/0102767 A1 Apr. 12, 2018

(30) Foreign Application Priority Data

Oct. 7, 2016 (TW) .............................. 105132625 A (51) Int. Cl.
  *H03K 21/00* (2006.01)
  *H03K 5/00* (2006.01)
  *H03K 21/10* (2006.01)
  *H02M 3/07* (2006.01)

(52) U.S. Cl.
  CPC .......... *H03K 5/00006* (2013.01); *H02M 3/07* (2013.01); *H03K 21/10* (2013.01)

(58) Field of Classification Search
  None
  See application file for complete search history.

(56) References Cited

U.S. PATENT DOCUMENTS

| 9,007,791 | B2* | 4/2015 | Marsili | H02M 3/07 307/110 |
| 2011/0128761 | A1* | 6/2011 | Ripley | H02M 3/07 363/62 |
| 2014/0084890 | A1* | 3/2014 | Philip | H02M 1/146 323/284 |
| 2015/0008894 | A1* | 1/2015 | Cannankurichi | H02M 1/36 323/282 |
| 2015/0022169 | A1* | 1/2015 | Cannankurichi Vijaya Mohan .... | H02M 3/07 323/282 |
| 2015/0061613 | A1* | 3/2015 | Kondou | H02M 3/158 323/271 |
| 2015/0180355 | A1* | 6/2015 | Freeman | H02M 1/08 363/21.04 |

(Continued)

*Primary Examiner* — Lincoln D Donovan
*Assistant Examiner* — Khareem E Almo
(74) *Attorney, Agent, or Firm* — Muncy, Geissler, Olds & Lowe, P.C.

(57) ABSTRACT

Illustrated are a switched-capacitor DC-DC convertor and a control method thereof. The switched-capacitor DC-DC convertor includes a switched-capacitor circuit, a latched comparator and a clock generating module. The switched-capacitor circuit converts an input voltage into an output voltage through a phase switching operation. The latched comparator receives a clock signal, and compares the output voltage and a reference voltage according to the clock signal, to generate the control signal, which triggers a phase switching operation of the switched-capacitor circuit. The clock generating module generates the clock signal, and adjusts a frequency of the clock signal according to variation of the control signal.

8 Claims, 8 Drawing Sheets

(56) References Cited

U.S. PATENT DOCUMENTS

| | | | |
|---|---|---|---|
| 2015/0236583 A1* | 8/2015 | Ripley | H02M 3/06 323/234 |
| 2016/0211832 A1* | 7/2016 | Moore | H03K 3/356104 |
| 2017/0047843 A1* | 2/2017 | Bawa | H02M 3/156 |
| 2017/0170722 A1* | 6/2017 | Jung | H02M 3/07 |
| 2017/0279350 A1* | 9/2017 | Liu | H03K 17/005 |
| 2017/0302180 A1* | 10/2017 | Villar Pique | H02M 1/08 |
| 2017/0366086 A1* | 12/2017 | Calhoun | H02M 3/158 |
| 2018/0019667 A1* | 1/2018 | Salem | H02M 3/07 |

\* cited by examiner

SWITCHED-CAPACITOR DC-DC CONVERTOR AND CONTROL METHOD THEREOF

CROSS-REFERENCE TO RELATED APPLICATION

This application claims the benefit of Taiwan Patent Application No. 105132625, filed on Oct. 7, 2016, at the Taiwan Intellectual Property Office, the disclosure of which is incorporated herein in its entirety by reference.

BACKGROUND OF THE INVENTION

1. Field of the Invention

The present disclosure relates to a switched-capacitor DC-DC convertor and a control method thereof. More particularly, the present disclosure relates to a switched-capacitor DC-DC convertor which is capable of adjusting a frequency of an internal clock signal according to variation of an output voltage, so as to effectively reduce power consumption.

2. Description of the Related Art

There is a trend for microprocessors, or microcontrollers (MCUs), and consumer electronics in general to reduce consumption in mobile or Internet of Things (IoT) applications. More particularly, microprocessors used in mobile or IoT applications most of the time operate with light loads and a microprocessor or an MCU commonly uses a switched-capacitor DC-DC convertor as the power circuit. Therefore, the design of a novel switched-capacitor DC-DC convertor which has a high efficiency and low power consumption when under light loads is of great importance.

SUMMARY OF THE INVENTION

An objective of the invention of present disclosure is to provide a switched-capacitor DC-DC convertor which includes at least one switched-capacitor circuit, a latched comparator and a clock generating module. The switched-capacitor circuit has an input terminal configured to receive an input voltage, an output terminal configured to output an output voltage, and a signal input terminal configured to receive a control signal for a phase switching operation in which the at least one switched-capacitor circuit converts the input voltage into the output voltage. The latched comparator has a first input terminal coupled to the output terminal of the switched-capacitor circuit, a second input terminal configured to receive a reference voltage, and a third input terminal configured to receive a clock signal. The latched comparator is configured to compare the output voltage with the reference voltage, so as to generate the control signal. The clock generating module is configured to generate and output the clock signal to the latched comparator and adjust a frequency of the clock signal according to variation of the control signal.

Preferably, the control signal includes a plurality of pulses, and the switched-capacitor circuit performs the phase switching operation according to the plurality of pulses.

Preferably, the clock generating module decreases the frequency of the clock signal when a number of the plurality of pulses decreases within a preset period of time, and the clock generating module increases the frequency of the clock signal when the number of the plurality of pulses increases within the preset period of time.

Preferably, when the latched comparator does not generate a pulse during a predetermined number of cycles of the clock signal after the last pulse of the control signal, the clock generating module decreases the frequency of the clock signal.

Preferably, when the latched comparator continuously generates pulses during the plurality of cycles of the clock signal, the clock generating module increases the frequency of the clock signal.

Preferably, the clock generating module includes a frequency divider circuit configured to decrease the frequency of the clock signal, and a frequency multiplier circuit configured to increase the frequency of the clock signal.

Preferably, the switched-capacitor DC-DC convertor of the present disclosure further includes a counter coupled to the output terminal of the latched comparator and configured to count the number of the plurality of pulses of the control signal.

Preferably, the clock generating module is a voltage-controlled oscillator (VCO), and the frequency of the clock signal outputted by the voltage-controlled oscillator is changed by adjusting a voltage inputted to the voltage-controlled oscillator Another objective of the invention of the present disclosure is to provide a control method for the switched-capacitor DC-DC convertor. The control method includes the steps of: disposing at least one switched-capacitor circuit which has an input terminal configured to receive an input voltage, an output terminal configured to output an output voltage, and a signal input terminal configured to receive a control signal for a phase switching operation in which the at least one switched-capacitor circuit converts the input voltage to the output voltage; disposing a latched comparator which has a first input terminal coupled to the output terminal of the switched-capacitor circuit, a second input terminal configured to receive a reference voltage, and a third input terminal configured to receive a clock signal, wherein the latched comparator is configured to compare the output voltage with the reference voltage, so as to generate the control signal; and disposing a clock generating module which is configured to generate and output the clock signal to the latched comparator and adjust a frequency of the clock signal according to variation of the control signal.

Preferably, the control signal includes a plurality of pulses, and the clock generating module decreases the frequency of the clock signal when a number of the plurality of pulses decreases within a preset period of time, and the clock generating module increases the frequency of the clock signal when the number of the plurality of pulses increases within the preset period of time.

Preferably, when the latched comparator does not generate a pulse during a predetermined number of cycles of the clock signal after the last pulse of the control signal, the clock generating module decreases the frequency of the clock signal.

Preferably, the clock generating module is a voltage-controlled oscillator (VCO), and the frequency of the clock signal outputted by the voltage-controlled oscillator is changed by adjusting a voltage inputted to the voltage-controlled oscillator.

Another objective of the invention of the present disclosure is to provide a switched-capacitor DC-DC convertor which includes at least one switched-capacitor circuit, a latched comparator and a clock generating module. The switched-capacitor circuit has an input terminal configured to receive an input voltage, an output terminal coupled to a load circuit and configured to output an output voltage, and a signal input terminal configured to receive a control signal for a phase switching operation in which the at least one switched-capacitor circuit converts the input voltage into the output voltage. The latched comparator has a first input terminal coupled to the output terminal of the switched-capacitor circuit, a second input terminal configured to receive a reference voltage, and a third input terminal configured to receive a clock signal. The latched comparator is configured to compare the output voltage with the reference voltage, so as to generate the control signal. The clock generating module is configured to generate and output the clock signal to the latched comparator, and decrease a frequency of the clock signal when the load circuit is a light load, and increase the frequency of the clock signal when the load circuit is a heavy load.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present invention. As used herein, the term "or" includes any and all combinations of one or more of the associated listed items.

Figure 1:
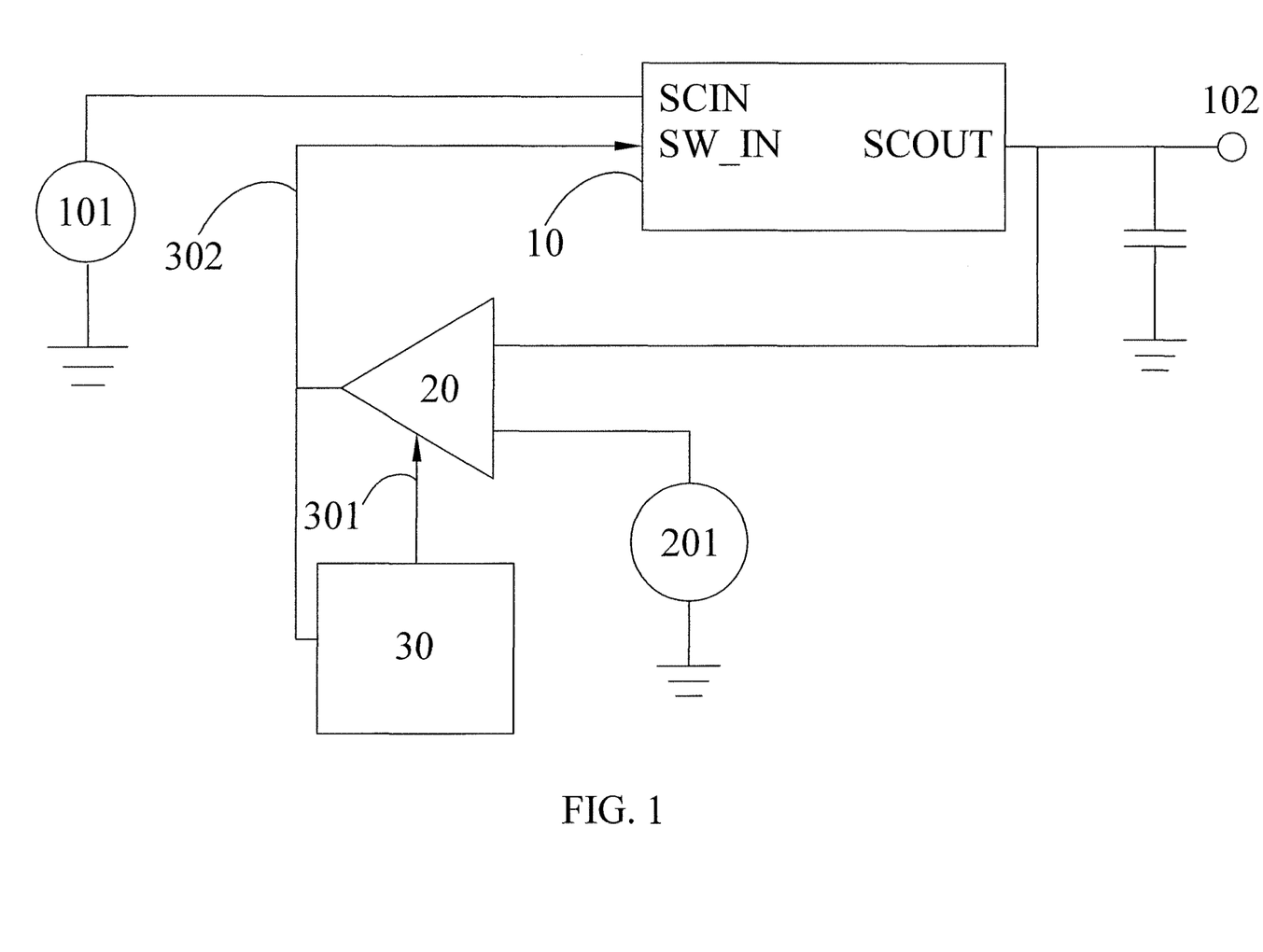
FIG. 1 is a block diagram of a switched-capacitor DC-DC convertor of the present disclosure.

The following refers to FIG. 1, which is a block diagram of a switched-capacitor DC-DC convertor of the present disclosure. The switched-capacitor DC-DC convertor includes at least one switched-capacitor circuit 10, a latched comparator 20 and a clock generating module 30. The switched-capacitor circuit 10 has an input terminal SCIN configured to receive an input voltage 101, an output terminal SCOUT configured to output an output voltage 102, and a signal input terminal SW_IN configured to receive a control signal 302 for a phase switching operation in which the switched-capacitor circuit 10 converts the input voltage 101 into the output voltage 102. The clock generating module 30 is configured to generate and output the clock signal 301 to the latched comparator 20.

The latched comparator 20 has a first input terminal coupled to the output terminal SCOUT of the switched-capacitor circuit 10, and a second input terminal configured to receive a reference voltage 201, and a third input terminal configured to receive a clock signal 301. The latched comparator 20 is configured to compare the output voltage 102 with the reference voltage 201 according to the clock signal 301. For example, the latched comparator 20 is triggered to perform a comparison at the point in time of a rising edge of the clock signal 301, so as to generate the control signal 302 based on the comparison result.

Figure 2:
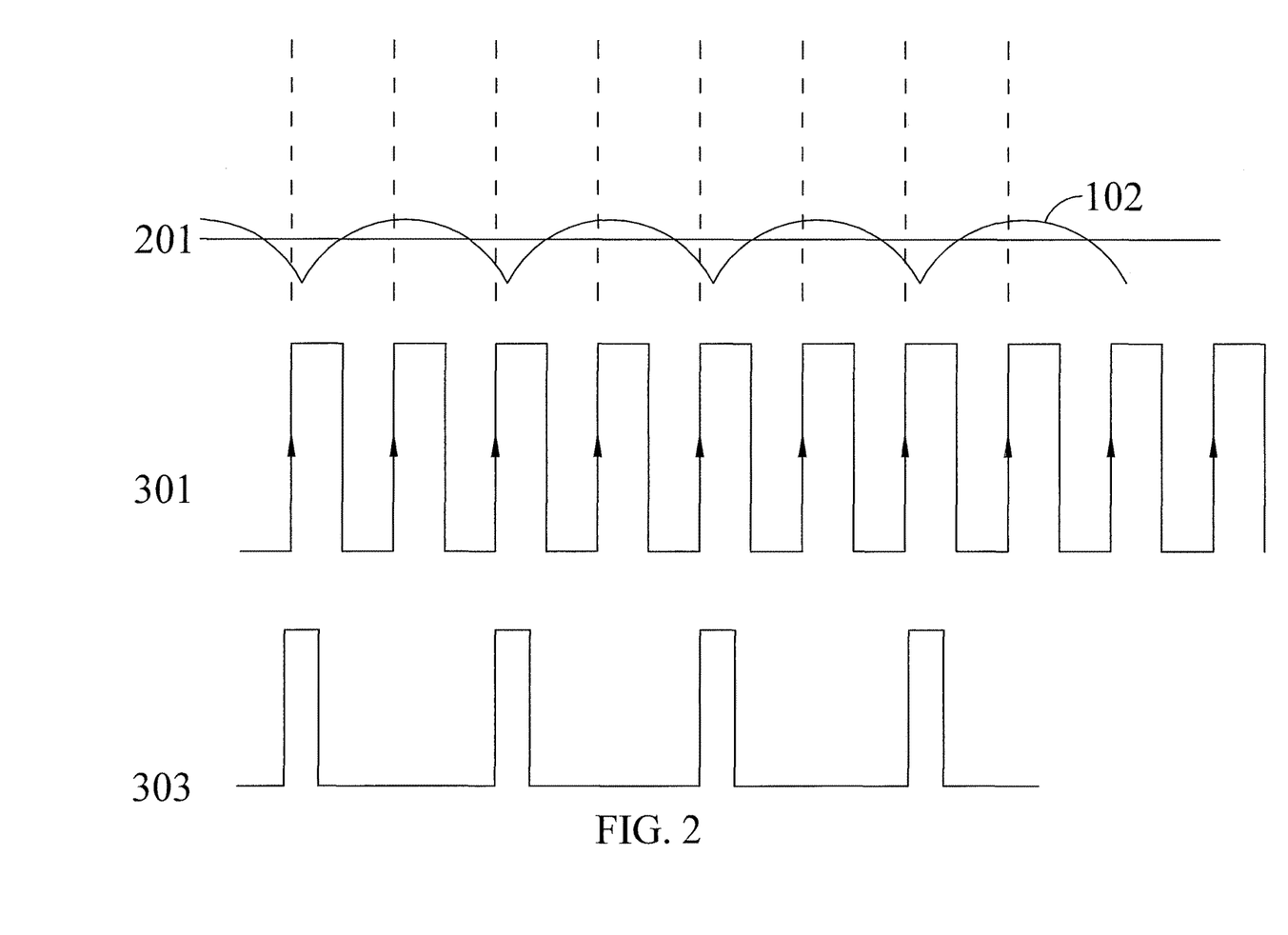
FIG. 2 is a signal waveform diagram of the switched-capacitor DC-DC convertor of the present disclosure.

Preferably, the control signal 302 includes a plurality of pulses 303 as follows and as illustrated in FIG. 2. If at the rising edge of the clock signal 301, when the latched comparator 20 is activated to compare the output voltage 102 and the reference voltage 201, the latched comparator 20 determines that the output voltage 102 is lower than the reference voltage 201, then the latched comparator 20 outputs a pulse 303 as the control signal 301 to the switched-capacitor circuit 10, so as to trigger the switched-capacitor circuit 10 to perform the phase switching operation to pull up the output voltage 102. On the other hand, when the latched comparator 20 determines that the output voltage 102 is not lower than the reference voltage 201, then the latched comparator 20 does not output a pulse. Therefore, when the output voltage 102 drops below the reference voltage 201, the latched comparator 20 outputs a pulse at the point in time point of the rising edge of the clock signal, so as to trigger the switched-capacitor circuit 10 to pull up the output voltage 102. According to above-mentioned control scheme, the output voltage 102 is kept higher than the reference voltage 201 during most of the operation time of the switched-capacitor circuit 10.

However, the clock generating module 30 still consumes a certain degree of power in the aforementioned control scheme, and its power consumption is practically proportional to the frequency of the clock signal 301. Therefore, the clock generating module 30 of the present disclosure adjusts the frequency of the clock signal 301 according to variation of the control signal 302, so as to reduce the power consumption of the switched-capacitor DC-DC convertor as far as possible. For example, when a number of the pulses 303 decreases, then this indicates that the switched-capacitor circuit 10 is under a light load and the output voltage 102 drops slowly, and in response the clock generating module 30 decreases the frequency of the clock signal 301, resulting in a lower power consumption of the clock generating module 30, and thereby reducing overall power consumption of the switched-capacitor DC-DC convertor.

When the number of the pulses 303 increases, this indicates a fast drop in the output voltage 102 and that the switched-capacitor circuit 10 is under a heavy load. Generally, the switched-capacitor DC-DC convertor draws more current under a heavy load, so the drop in the output voltage 102 is faster than that under a light load. In order to compensate for a heavy load, the clock generating module 30 can increase the frequency of the clock signal 301, so that the latched comparator 20 can compare the output voltage 102 and the reference voltage 201 more frequently, and the switched-capacitor circuit 10 can perform the phase switching operation more frequently to keep the output voltage 102 higher than the reference voltage 201 as much as possible.

Figure 3:
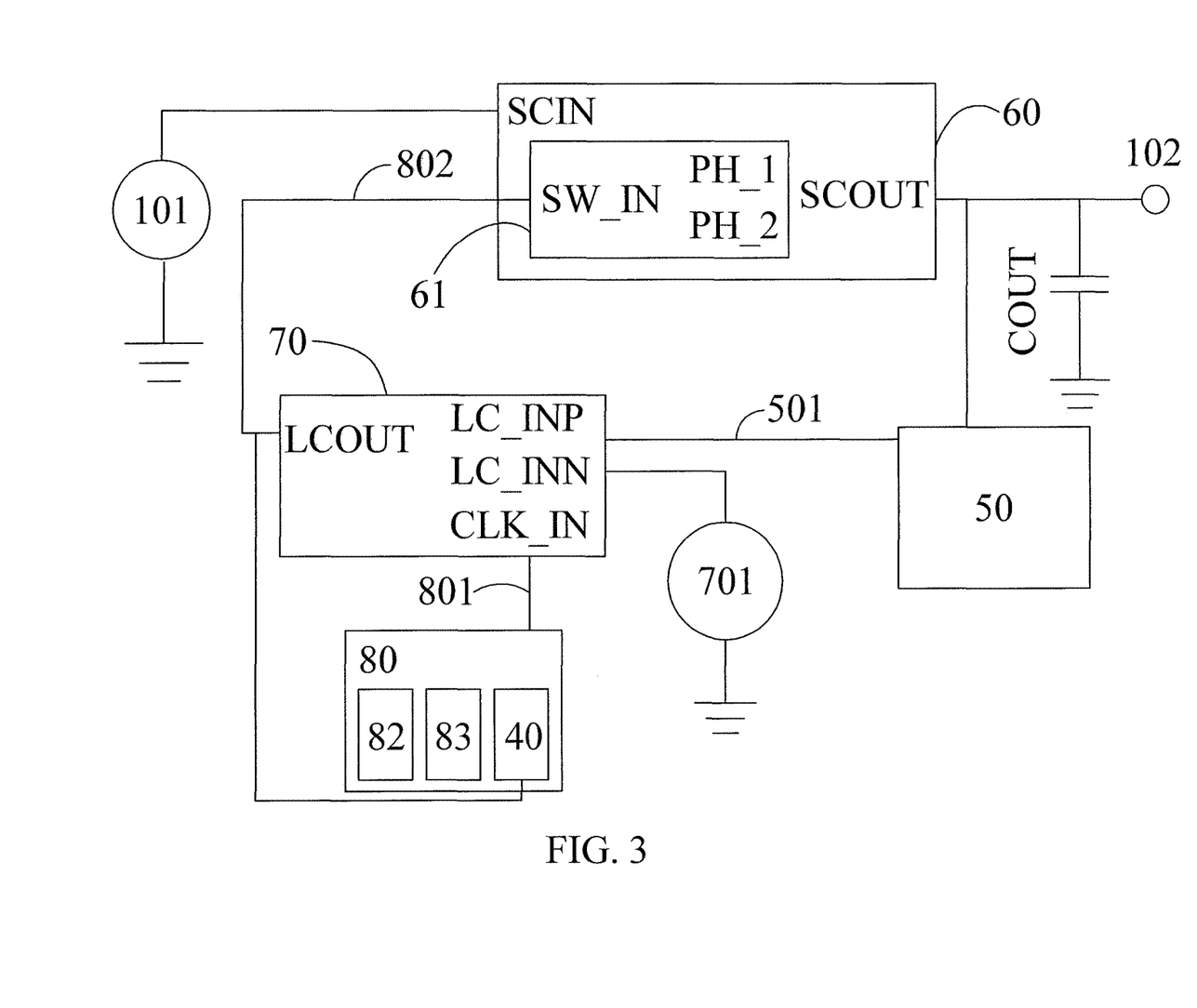
FIG. 3 is a block diagram of an embodiment of the switched-capacitor DC-DC convertor of the present disclosure.

The following refers to FIG. 3, which shows a block diagram of an embodiment of the switched-capacitor DC-DC convertor of the present disclosure. In the embodiment, the switched-capacitor DC-DC convertor includes a switched-capacitor circuit 60, a latched comparator 70, a clock generating module 80, a counter 40 and a voltage divider 50. The switched-capacitor circuit 60 has a signal input terminal SW_IN, an input terminal SCIN and an output terminal SCOUT, and includes a logic phase controller 61 having a first control terminal PH_1 and a second control terminal PH_2.

As shown in FIG. 3, the input terminal SCIN receives the input voltage 101, the signal input terminal SW_IN receives a control signal 802, and the output terminal SCOUT outputs the output voltage 102. The output terminal SCOUT of the switched-capacitor circuit 60 is coupled to an output capacitor COUT and the voltage divider 50. A feedback voltage 501 is formed in the voltage divider 50.

The latched comparator 70 has a first input terminal LC_INP, a second input terminal LC_INN, a third input terminal CLK_IN and an output terminal LCOUT. The clock generating module 80 inputs a clock signal 801 to the third input terminal CLK_IN, and the clock signal 801 is a particular type of signal that oscillates between a high and a low state. According to the clock signal 801, the latched comparator 70 periodically compares the voltages on the first input terminal LC_INP and the second input terminal LC_INN, and outputs a control signal 802 based on the comparison result. Upon receipt of the pulses of the control signal 802, the logic phase controller 61 controls the phase switching operation of the switched-capacitor circuit 60. The switched-capacitor circuit 60 generally includes multiple switches (not shown in the figures) divided into two sets, and the two sets of switches are controlled by different phase signals with complementary phases, meaning that, for example, when a set of switches are open, the other set of switches are closed. The logic phase controller 61 is used to periodically open and close the two sets of switches according to the control signal 802, so as to convert the input voltage into the output voltage. The feedback voltage 501 is proportional to the output voltage 102. The switched-capacitor circuit 60 is a well-known technology for those skilled in the art, so its detailed description is omitted in the present disclosure.

The clock generating module 80 includes a frequency divider circuit 82, a frequency multiplier circuit 83 and a counter 40. Before the clock signal 801 is outputted from the clock generating module 80, the frequency divider circuit 82 and the frequency multiplier circuit 83 can be used to respectively decrease or increase the frequency of the clock signal 801. For example, if the latched comparator 20 generates pulses 303 during a predetermined number of consecutive cycles of the clock signal 801, the clock generating module 80 uses the frequency multiplier circuit 83 to increase the frequency of the clock signal 801. The counter 40 is coupled to the output terminal of the latched comparator 70 and configured to count the number of the pulses 303 of the control signal 802 in a preset period of time.

For example, the output voltage 102 and the reference voltage 701 are fed into the first input terminal LC_INP and the second input terminal LC_INN respectively, and compared with each other when the latched comparator 70 is triggered by the rising edge or falling edge of the clock signal 801. The comparison result is stored and latched as the output signal in the latched comparator 70. When the clock signal 801 is at a low voltage level, the latched comparator 70 resets the comparison result. Thus, each time the output voltage 102 drops below the reference voltage 701, the latched comparator 70 outputs the control signal 302 with a pulse to the logic phase controller 61; and upon receipt of the pulse of the control signal 302, the logic phase controller 61 controls the switched-capacitor circuit 60 to switch its operation mode, so as to pull up the output voltage 102.

Preferably, the logic phase controller 61 of the switched-capacitor circuit 60 may be a non-overlapping switching controller which generates a first control signal and a second control signal according to the control signal 802, and separately inputs them into the first control terminal PH_1 and the second control terminal PH_2 of the switched-capacitor circuit 60 to control the switches of the switched-capacitor circuit 60. The first control signal and the second control signal do not overlap.

In practice, the invention of the present disclosure may also use a multi-phase switched-capacitor circuit which includes a plurality of switched-capacitor circuits 60 and a plurality of logic phase controllers 61 to control a plurality of multi-phase signals of the multi-phase switched-capacitor circuit.

The power consumption of the clock generating module 80 is practically proportional to the frequency of the clock signal, and the power consumption of the latched comparator 70 is also practically proportional to its operational frequency, so in order to reduce power consumption, the frequency of the clock signal 801 of the clock generating module 80 is dynamically adjusted according to the number of the pulses 303 generated in a preset period of time. For example, in a single-phase switched-capacitor circuit 60, if the latched comparator 70 has not triggered the switched-capacitor circuit 60 after M consecutive cycles of the clock signal 801, then this indicates that the switched-capacitor circuit 60 has not drawn a large current and is under a light load, and so the clock generating module 80 then decrease its operational frequency, which entails outputting the clock signal 801 at a lower frequency. As a result, when the output current of the switched-capacitor circuit 60 stays low and the drop in the output voltage 102 is slow, the clock generating module 80 can gradually decrease it operational frequency, so as to further reduce power consumption.

Figure 4:
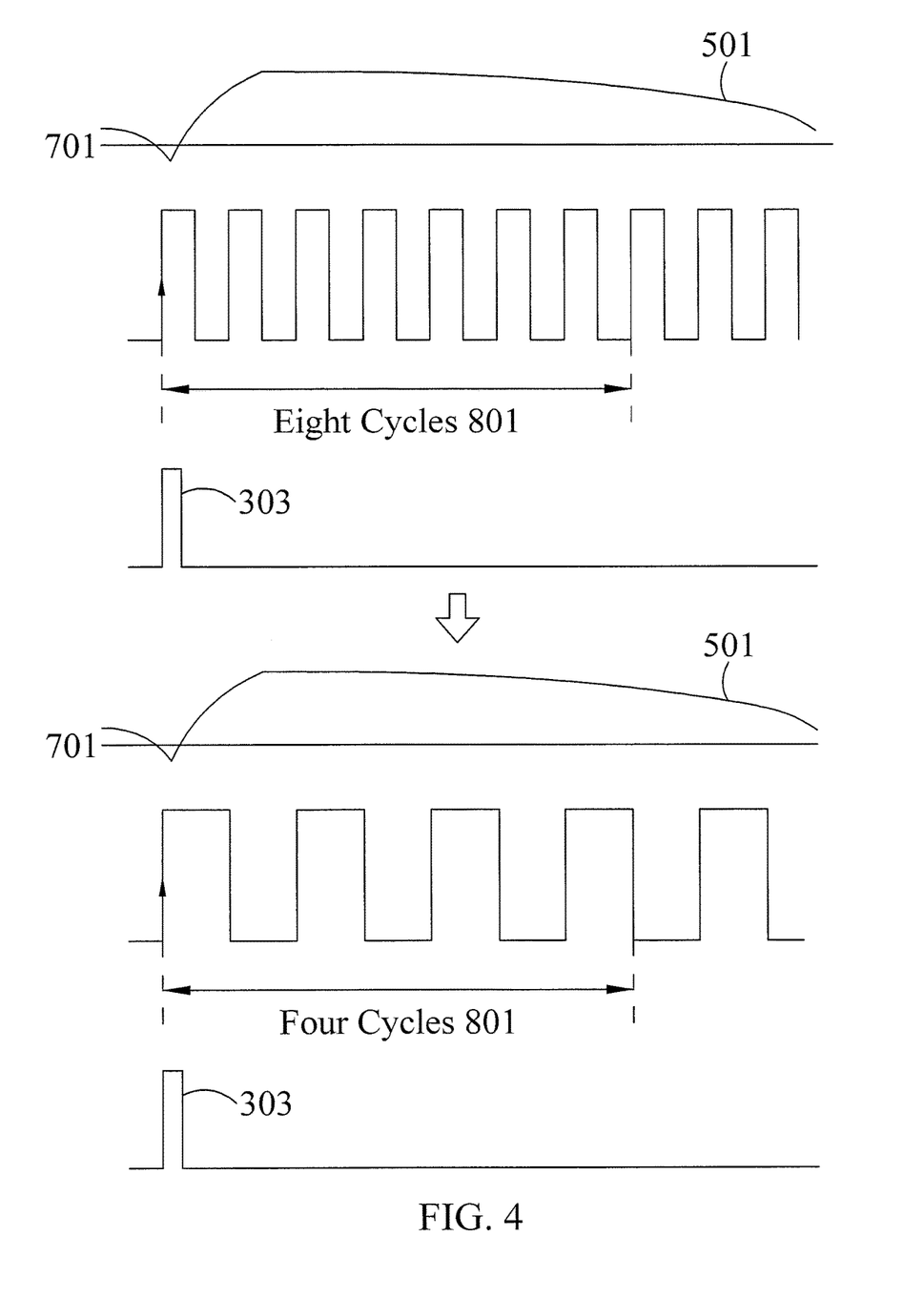
FIG. 4 is a schematic view showing a scheme in which a clock generating module decreases a frequency of a clock signal in the switched-capacitor DC-DC convertor of the present disclosure.

The following refers to FIG. 4, which is a schematic view of scheme where the switched-capacitor DC-DC convertor decreases the frequency of the clock signal.

As shown in FIG. 4, if the latched comparator 70 has not triggered the switched-capacitor circuit 60 after 8 consecutive cycles of clock signal 801, the frequency divider circuit 82 of the clock generating module 80 decreases the frequency of the clock signal 801. As a result of decreasing the frequency of the generated clock signal, the latched comparator 70 compares the output voltage 102 with the reference voltage less frequently (for example in FIG. 4, the comparison is taken ten times before and then five times after the frequency of the clock signal 801 is decreased), in order to reduce power consumption. Following this, if the latched comparator 70 has still not triggered the switched-capacitor circuit 60 after 8 consecutive cycles of the clock signal 801, then this means that the frequency of the clock signal 801 can be further decreased.

Therefore, the clock generating module 80 can change the frequency of the clock signal 801 in response to the variation of the feedback voltage 501, so that the clock signal 801 may have a lower frequency when the switched-capacitor circuit 60 is under a light load; and thereby effectively reducing the power consumption of the switched-capacitor DC-DC convertor.

Figure 5:
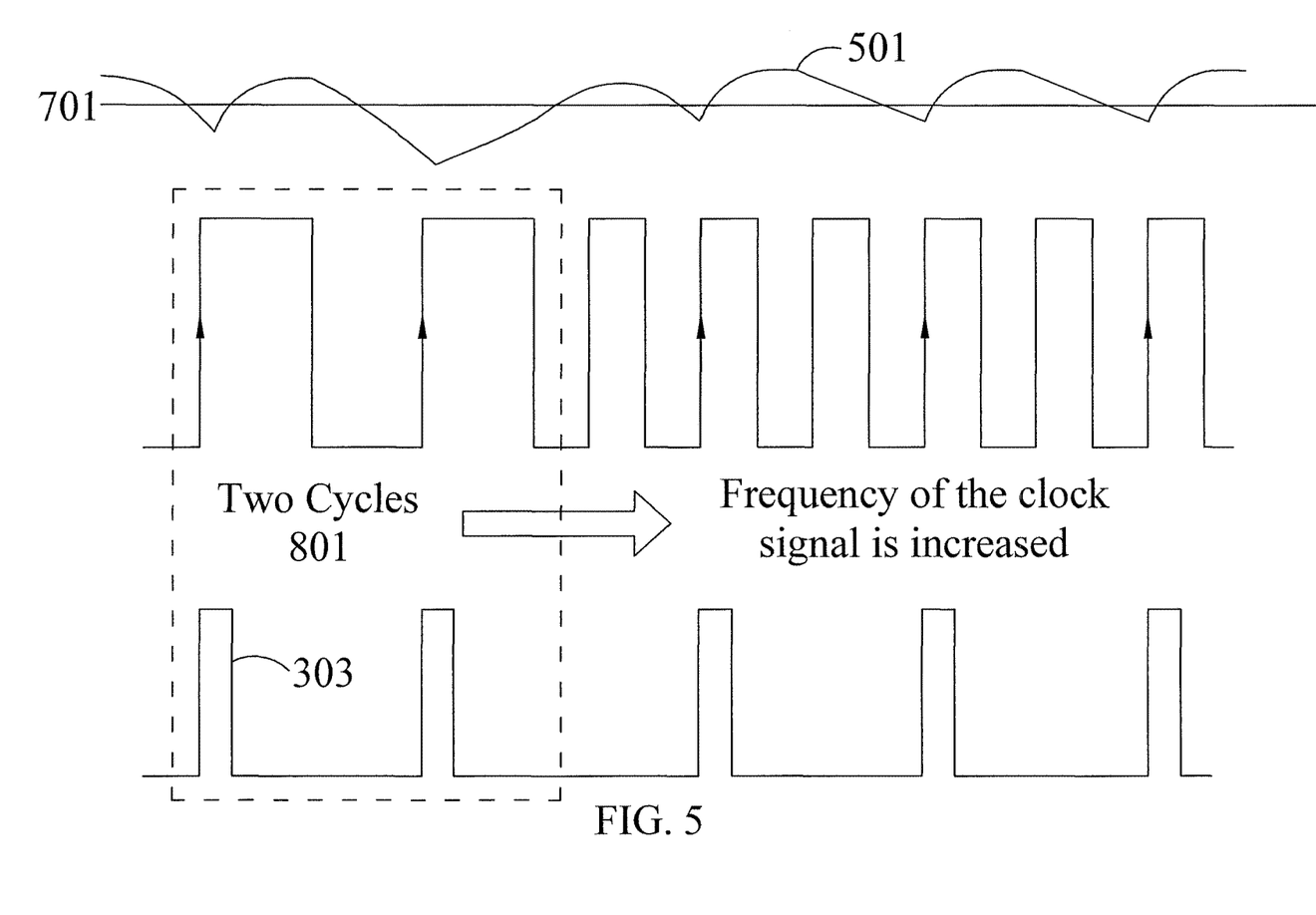
FIG. 5 is a schematic view showing a scheme in which a clock generating module increases the frequency of the clock signal in the switched-capacitor DC-DC convertor of the present disclosure.

The following refers to FIG. 5, which is a schematic view of the scheme where the frequency of the clock signal is increased.

As shown in FIG. 5, an increased output current indicates that the switched-capacitor circuit 60 is under a heavy load, resulting in a faster drop in the feedback voltage 501, and this leads to the clock generating module 80 increasing the frequency of the clock signal 801. In the embodiment, the frequency of the clock signal 801 is increased at the times at which the latched comparator 70 triggers the switched-capacitor circuit 60. For example, when the latched comparator 70 triggers the switched-capacitor circuit 60 during two consecutive cycles of the clock signal period, this indicates an increase in the output current and that the feedback voltage, which is proportional to the output voltage 102, has successively dropped or remained below the reference voltage. In this case, the frequency multiplier circuit 83 increases the frequency of the clock signal 801 to enable the latched comparator 70 to more frequently trigger the switched-capacitor circuit 60 in order to pull up the output voltage 102.

The scheme of adjusting the frequency of the clock signal 301 may be different to that just described. For example, in another embodiment, if after the latched comparator 20 generates a first pulse 303 of the control signal 302 and then no more pulses are generated in a predetermined period of time, such as the time period of a predetermined number of cycles of the clock signal 301, then in response the clock generating module 30 decreases the frequency of the clock signal 301. The process of decreasing the frequency is as described above, so its detailed description is not repeated here.

Figure 6:
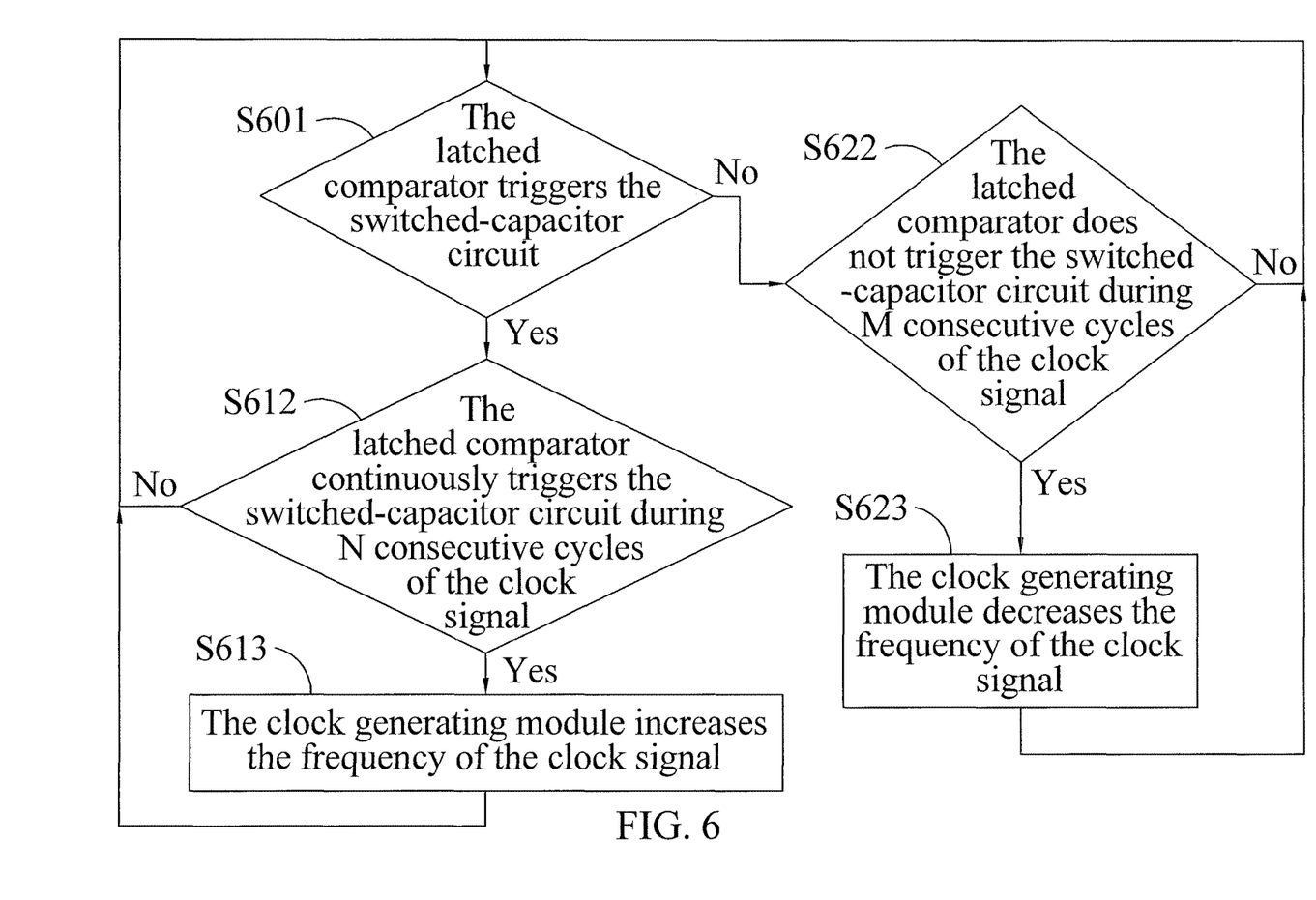
FIG. 6 is a flowchart of a control method for the switched-capacitor DC-DC convertor of the present disclosure.
Figure 7:
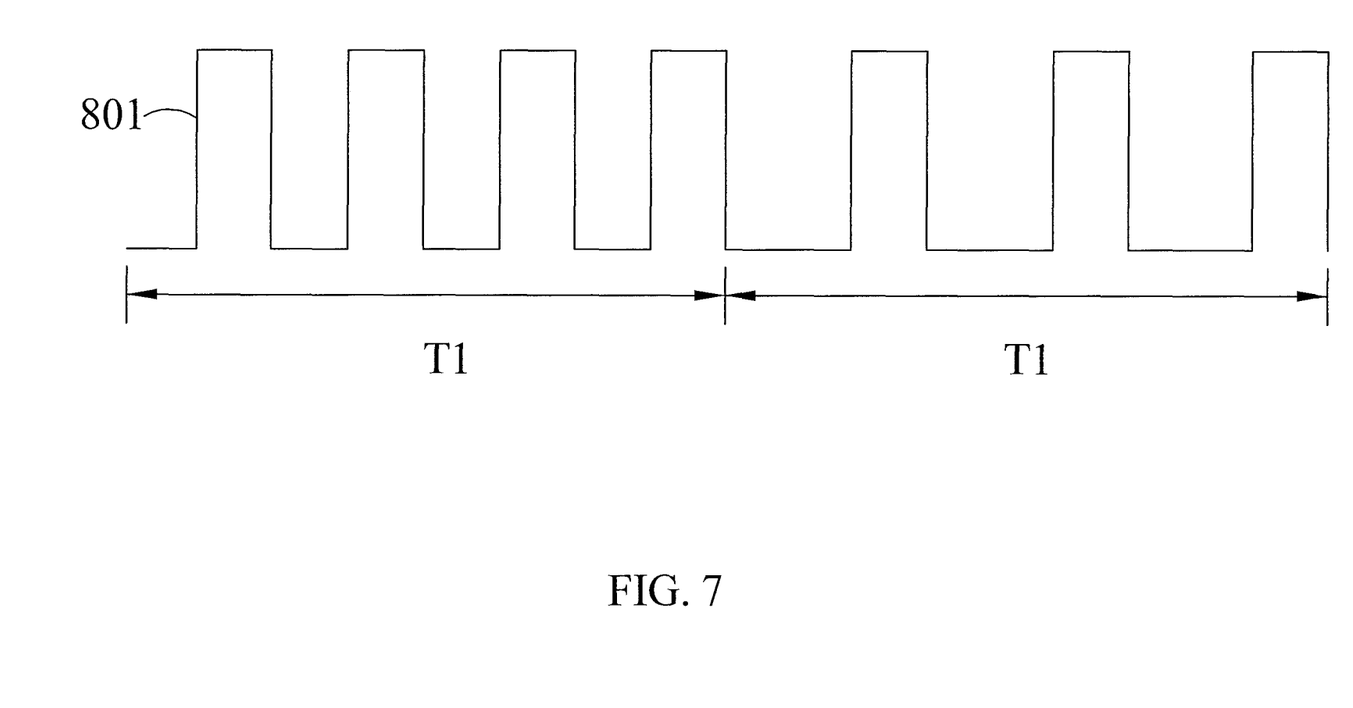
FIG. 7 is a schematic view showing the scheme in which the frequency of the clock signal is decreased in the switched-capacitor DC-DC convertor of the present disclosure.
Figure 8:
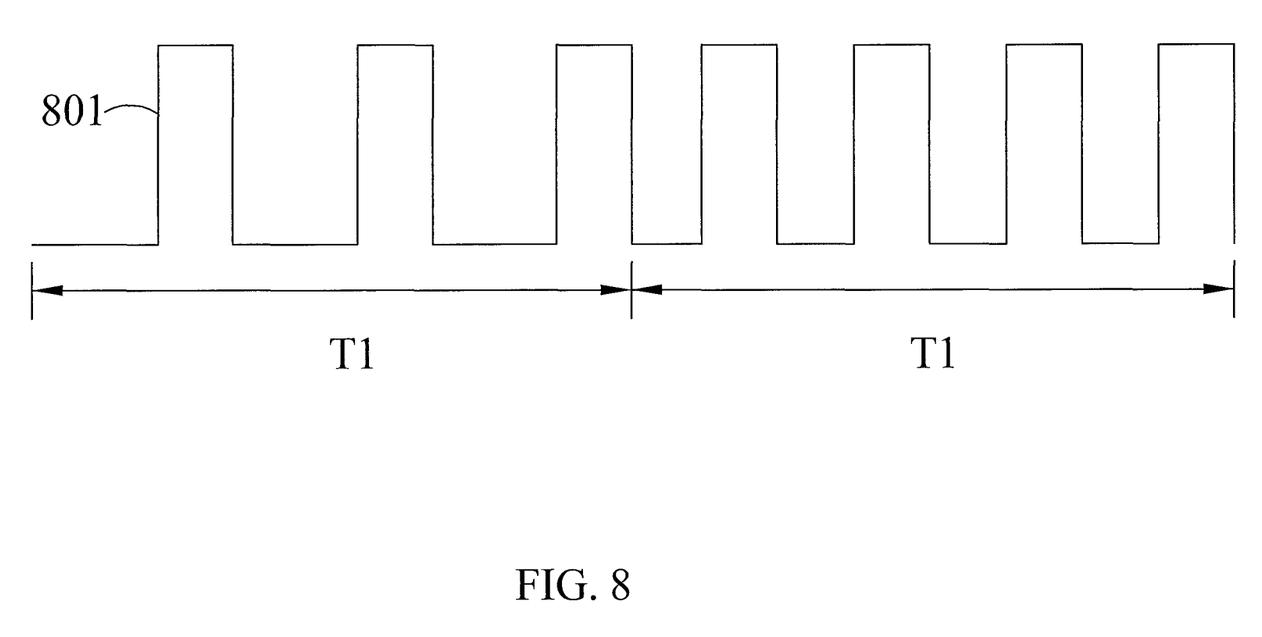
FIG. 8 is a schematic view showing the scheme in which the frequency of the clock signal is increased in the switched-capacitor DC-DC convertor of the present disclosure.

The following refers to FIGS. 6 through 8, where FIG. 6 is a flowchart showing the control method for the switched-capacitor DC-DC convertor of the present disclosure, and FIGS. 7 and 8 are schematic views of the scheme for decreasing and increasing the frequency of the clock signal respectively.

The steps of the control method for the switched-capacitor as shown in steps S601 through S623 in FIG. 6 are described as follows. In a step S601, it is determined whether the latched comparator triggers the switched-capacitor circuit. If true, that is the latched comparator 70 has triggered the switched-capacitor circuit, and furthermore if a step S612 is also true, that is the latched comparator 70 also continuously triggers the switched-capacitor circuit 60 during N consecutive cycles of the clock signal, then in a step S613 the clock generating module increases the frequency of the clock signal. As shown in FIG. 8, when the latched comparator 70 continuously triggers the switched-capacitor circuit 60 in each of the 3 consecutive cycles of the clock signal in the first T1 time period, then the frequency of the clock signal 801 is increased in the next T1 time period. That is, the number of cycles of the clock signal 801 in the second time period T1 is four, so that the latched comparator 70 compares the output voltage and reference voltage more frequently. When the latched comparator 70 does not continuously trigger the switched-capacitor circuit 60 in each of the 3 consecutive cycles of the clock signal in the first time period T1, then the frequency of the clock signal 801 is kept the same in next time period T1. Then, the scheme of adjusting the frequency of the clock signal is performed again in the next time period T1.

When in a step S622 the latched comparator 70 does not trigger the switched-capacitor circuit during M consecutive cycles of the clock signal, then in a step S623 the clock generating module decreases the frequency of the clock signal. For example, in FIG. 7, when the latched comparator does not trigger the switched-capacitor circuit during four consecutive cycles of the clock signal in the first time period T1, then the frequency of the clock signal is decreased in the next time period T1, that is the number of cycles of the clock signal is decreased to three in the second time period T1. When the latched comparator 70 triggers the switched-capacitor circuit in at least one but not all of M cycles of the clock signal, then the frequency of the clock signal is kept the same.

In other embodiment, the switched-capacitor circuit may be coupled with a load circuit, and the switched-capacitor DC-DC convertor may receive a signal indicative of a state of the load circuit, for example, when the switched-capacitor DC-DC convertor receives the signal indicating that the load circuit becomes a light load, it means that the switched-capacitor circuit is under the light load, the clock generating module may directly decrease the frequency of the clock signal; on the contrary, when the switched-capacitor DC-DC convertor receives the signal indicating that the load circuit becomes a heavy load, it means that the switched-capacitor circuit is under the heavy load, the clock generating module may directly increase the frequency of the clock signal.

It should be noted that the aforementioned embodiment that uses the frequency divider circuit and the frequency multiplier circuit is taken as an example to illustrate a way of increasing or decreasing the frequency of the clock signal outputted by the clock generating module, but the present disclosure is not limited thereto. One of ordinary skill in the art can use various known technologies for the clock generating module to change the frequency of the clock signal. For example, the clock generating module may be a voltage-controlled oscillator (VCO), and the frequency of the clock signal outputted by the voltage-controlled oscillator can be changed by adjusting the voltage inputted to the voltage-controlled oscillator. Alternatively, the clock generating module may include at least one switch and multiple oscillators with different frequencies, and when a clock signal with a lower frequency is required, the switch may be controlled to enable an oscillator with a lower frequency to generate the clock signal. On the other hand, when a clock signal with a higher frequency is required, the switch may be controlled to enable an oscillator with a higher frequency to generate the clock signal.

Hence, any way of dynamically adjusting the frequency of the clock signals fed to the latched comparator 70 may be used in the present disclosure without departing from the spirit and scope of the invention set forth in the claims.

In conclusion, the switched-capacitor DC-DC convertor and the control method of the present disclosure can dynamically adjust the frequency of the clock signal when the switched-capacitor circuit is under a light load, thereby reducing power consumption.

The present invention disclosed herein has been described by means of specific embodiments. However, numerous modifications, variations and enhancements can be made thereto by those skilled in the art without departing from the spirit and scope of the invention set forth in the claims.

What is claimed is:

1. A switched-capacitor DC-DC convertor, comprising:
   at least one switched-capacitor circuit having an input terminal configured to receive an input voltage, an output terminal configured to output an output voltage, and a signal input terminal configured to receive a control signal for a phase switching operation in which the at least one switched-capacitor circuit converts the input voltage into the output voltage;
   a latched comparator having a first input terminal coupled to the output terminal of the switched-capacitor circuit, and a second input terminal configured to receive a reference voltage, and a third input terminal configured to receive a clock signal, wherein the latched comparator is configured to compare the output voltage with the reference voltage, so as to generate the control signal comprising a plurality of pulses, and the at least one switched-capacitor circuit performs the phase switching operation according to the plurality of pulses;
   a clock generating module configured to generate and output the clock signal to the latched comparator, and dynamically adjust a frequency of the clock signal according to existence or non-existence of the plurality of pulses of the control signal in a plurality of consecutive cycles of the clock signal; and
   a counter coupled to the output terminal of the latched comparator and configured to count the number of the plurality of pulses of the control signal;
   wherein when the latched comparator continuously generates pulses during the plurality of cycles of the clock signal, the clock generating module increases the frequency of the clock signal.

2. The switched-capacitor DC-DC convertor according to claim 1, wherein the clock generating module decreases the frequency of the clock signal when a number of the plurality of pulses decreases within a preset period of time, and the clock generating module increases the frequency of the clock signal when the number of the plurality of pulses increases within the preset period of time.

3. The switched-capacitor DC-DC convertor according to claim 1, wherein when the latched comparator does not generate a pulse during a predetermined number of cycles of the clock signal after the last pulse of the control signal, the clock generating module decreases the frequency of the clock signal.

4. The switched-capacitor DC-DC convertor according to claim 1, wherein the clock generating module comprises a frequency divider circuit configured to decrease the frequency of the clock signal, and a frequency multiplier circuit configured to increase the frequency of the clock signal.

5. A control method for a switched-capacitor DC-DC convertor, comprising:
   disposing at least one switched-capacitor circuit which has an input terminal configured to receive an input voltage, an output terminal configured to output an output voltage, and a signal input terminal configured to receive a control signal for a phase switching operation in which the at least one switched-capacitor circuit converts the input voltage to the output voltage;
   disposing a latched comparator which has a first input terminal coupled to the output terminal of the switched-capacitor circuit, a second input terminal configured to receive a reference voltage, and a third input terminal configured to receive a clock signal, wherein the latched comparator is configured to compare the output voltage with the reference voltage, so as to generate the control signal comprising a plurality of pulses; and
   disposing a clock generating module which is configured to generate and output the clock signal to the latched comparator and dynamically adjust a frequency of the clock signal according to existence or non-existence of the plurality of pulses of the control signal in a plurality of consecutive cycles of the clock signal;
   wherein the clock generating module is a voltage-controlled oscillator (VCO), and the frequency of the clock signal outputted by the voltage-controlled oscillator is changed by adjusting a voltage inputted to the voltage-controlled oscillator.

6. The control method according to claim 5, wherein the clock generating module decreases the frequency of the clock signal when a number of the plurality of pulses decreases within a preset period of time, and the clock generating module increases the frequency of the clock signal when the number of the plurality of pulses increases within the preset period of time.

7. The control method according to claim 6, wherein when the latched comparator does not generate a pulse during a predetermined number of cycles of the clock signal after the last pulse of the control signal, the clock generating module decreases the frequency of the clock signal.

8. A switched-capacitor DC-DC convertor, comprising:
   at least one switched-capacitor circuit having an input terminal configured to receive an input voltage, an output terminal coupled to a load circuit and configured to output an output voltage, and a signal input terminal configured to receive a control signal for a phase switching operation in which the at least one switched-capacitor circuit converts the input voltage into the output voltage;
   a latched comparator having a first input terminal coupled to the output terminal of the switched-capacitor circuit, and a second input terminal configured to receive a reference voltage, and a third input terminal configured to receive a clock signal, wherein the latched comparator is configured to compare the output voltage with the reference voltage, so as to generate the control signal comprising a plurality of pulses; and
   a clock generating module configured to generate and output the clock signal to the latched comparator, and dynamically decrease a frequency of the clock signal when the plurality of pulses do not exist in a first plurality of consecutive cycles of the clock signal which represents the load circuit is a light load, and dynamically increase a frequency of the clock signal when the plurality of pulses exist in a second plurality of consecutive cycles of the clock signal which represents the load circuit is a heavy load;

wherein the clock generating module is a voltage-controlled oscillator (VCO), and the frequency of the clock signal outputted by the voltage-controlled oscillator is changed by adjusting a voltage inputted to the voltage-controlled oscillator.

* * * * *